US012604520B2

(12) United States Patent
Karda et al.

(10) Patent No.: US 12,604,520 B2
(45) Date of Patent: Apr. 14, 2026

(54) MICROELECTRONIC DEVICES INCLUDING VERTICAL INVERTERS, AND ELECTRONIC SYSTEMS

(71) Applicant: Micron Technology, Inc., Boise, ID (US)

(72) Inventors: Kamal M. Karda, Boise, ID (US); Durai Vishak Nirmal Ramaswamy, Boise, ID (US); Karthik Sarpatwari, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 765 days.

(21) Appl. No.: 17/661,979

(22) Filed: May 4, 2022

(65) Prior Publication Data

US 2023/0361118 A1      Nov. 9, 2023

(51) Int. Cl.
*H10D 84/85* (2025.01)
*H10D 30/63* (2025.01)

(52) U.S. Cl.
CPC ............. *H10D 84/85* (2025.01); *H10D 30/63* (2025.01)

(58) Field of Classification Search
CPC ............... H10D 30/63; H10D 30/6728; H10D 30/6704; H10D 30/674; H10D 84/0188; H10D 84/0195; H10D 84/0186; H10D 84/038; H10D 84/01; H10D 84/85; H10D 84/8311; H10D 84/8312; H10D 84/83135; H10D 84/83138; H10D 84/8314; H10D 84/8316; H10D 84/851; H10D 84/852; H10B 12/50
See application file for complete search history.

(56) References Cited

U.S. PATENT DOCUMENTS

| | | | |
|---|---|---|---|
| 4,810,906 A | 3/1989 | Shah et al. | |
| 6,689,660 B1 | 2/2004 | Noble et al. | |
| 8,860,127 B2 | 10/2014 | Cho et al. | |
| 9,680,473 B1 | 6/2017 | Anderson et al. | |
| 10,297,612 B2 | 5/2019 | Karda et al. | |
| 10,381,357 B2 | 8/2019 | Karda et al. | |
| 2001/0025985 A1 | 10/2001 | Noble | |
| 2017/0373071 A1* | 12/2017 | Lim | H10D 84/85 |
| 2018/0061835 A1* | 3/2018 | Yang | H10D 1/716 |

(Continued)

*Primary Examiner* — Ajay Ojha
(74) *Attorney, Agent, or Firm* — TraskBritt

(57) ABSTRACT

A microelectronic device comprises vertical inverter comprising a pillar structure vertically extending above a first conductive line. The pillar structure comprises a first vertical transistor vertically overlying and in electrical communication with the first conductive line, a second conductive line vertically overlying the first conductive line and electrically isolated from the first conductive line by a dielectric material, the second conductive line configured to be coupled to a ground structure, a second vertical transistor horizontally neighboring the first vertical transistor and in electrical communication with the second conductive line, the second vertical transistor horizontally spaced from the first vertical transistor by the dielectric material, and at least one electrode horizontally extending along a channel region of the first vertical transistor and an additional channel region of the second vertical transistor. Related microelectronic devices and electronic systems are also described.

20 Claims, 9 Drawing Sheets

(56)                          References Cited

U.S. PATENT DOCUMENTS

| | | | |
|---|---|---|---|
| 2018/0233503 A1 | 8/2018 | Balakrishnan et al. | |
| 2020/0111916 A1 | 4/2020 | Karda et al. | |
| 2020/0111917 A1* | 4/2020 | Ramaswamy | ..... H10D 30/6755 |
| 2020/0212226 A1 | 7/2020 | Reznicek et al. | |
| 2021/0066301 A1 | 3/2021 | Karda et al. | |
| 2021/0066302 A1 | 3/2021 | Karda et al. | |
| 2021/0183951 A1 | 6/2021 | Karda et al. | |
| 2022/0278112 A1* | 9/2022 | Karda | ................... H10B 41/70 |

\* cited by examiner

MICROELECTRONIC DEVICES INCLUDING VERTICAL INVERTERS, AND ELECTRONIC SYSTEMS

TECHNICAL FIELD

The disclosure, in various embodiments, relates generally to the field of microelectronic device design and fabrication. More specifically, the disclosure relates to microelectronic devices including vertical inverters, and to related electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g. access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. The control logic devices may be formed of arrays of transistors that form the control logic devices. However, as the number of member cells increases, the number of transistors for the control logic devices exhibits a corresponding increase. As the number of transistors increases, the surface area dedicated each single transistors must be decreased to fit a larger number of transistors within a unit area and form a device occupying less surface area on the silicon chip/die.

DETAILED DESCRIPTION

Figure 1A:
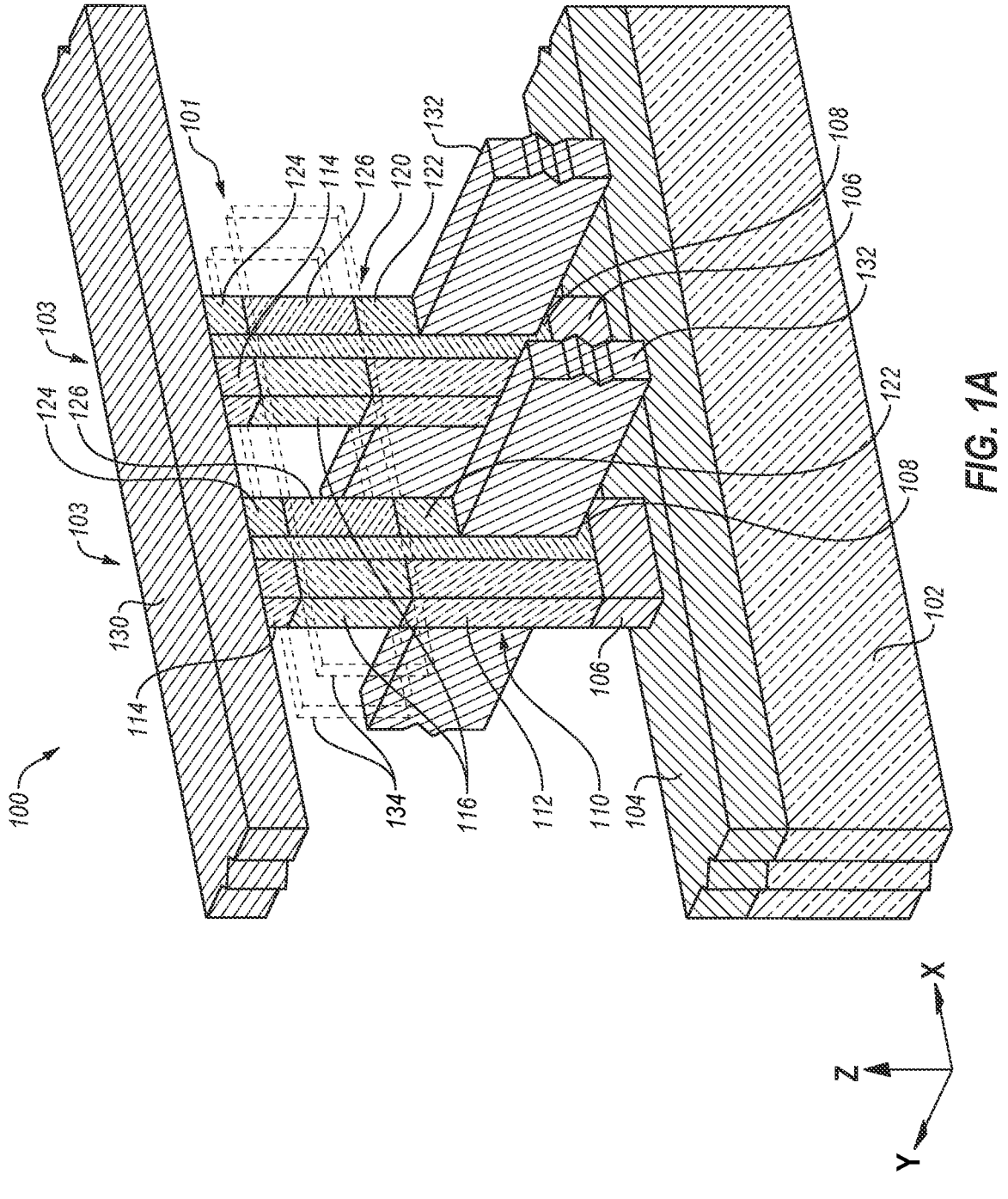
FIG. 1A through FIG. 1E are a simplified, partial perspective view (FIG. 1A), simplified, partial cross-sectional views (FIG. 1B through FIG. 1D), and a simplified, partial top-down view (FIG. 1E) of a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, the term "semiconductor material" refers to a material having an electrical conductivity between those of insulative materials and conductive materials. For example, a semiconductor material may have an electrical conductivity of between about 108 Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-X}As_yP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), gallium oxide ($Ga_xO$), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "NMOS" transistor means and includes a so-called metal-oxide transistor having a P-type channel region. The gate of the NMOS transistor may comprise a conductive metal, another conductive material, such as polysilicon, or a combination thereof. As used herein, the term "PMOS" transistor means and includes a so-called metal-oxide transistor having an N-type channel region. The gate of the PMOS transistor may comprise a conductive metal, another conductive material, such as polysilicon, or a combination thereof. Accordingly, the gate structures of such transistors may include conductive materials that are not necessarily metals.

According to embodiments described herein, an array of vertical inverters overlies a base material (e.g., a base substrate). The vertical inverters each individually includes a first vertical transistor and a second vertical transistor horizontally neighboring the first vertical transistor. The first vertical transistor includes a source region, a drain region, and a channel region vertically between the drain region and the channel region. The second vertical transistor includes an additional source region, an additional drain region, and an additional channel region vertically between the additional source region and the additional drain region. A dielectric material electrically isolates and horizontally intervenes between the first vertical transistor and the second vertical transistor. An additional dielectric material (e.g., a gate dielectric material) horizontally spaces the channel region and the additional channel region from one or more electrodes (e.g., gate electrodes) configured to provide an input voltage to the vertical inverter and induce the flow of a current in one or both of the channel region and the additional channel region. In some embodiments, the channel region and the additional channel region share the same one or more electrodes. In other words, the one or more electrodes are configured to individually be selectively coupled to each of the channel region and the additional channel region. Stated another way, the first vertical transistor and the second vertical transistor may be configured to be operated by (e.g., driven by) the same one or more electrodes. The one or more electrodes may extend in a first horizontal direction between multiple vertical inverters of the array of vertical inverters.

In some embodiments, the drain region of the first vertical transistor and the additional source region of the second vertical transistor are both in electrical communication with an output structure of the vertical inverter (e.g., voltage output structure). The source region of the first vertical transistor may be configured to be coupled to a supply pumped voltage ($V_{CCP}$) structure and the additional drain region of the second vertical transistor may be in contact (e.g., direct contact) with a ground line configured to couple the second vertical transistor to a ground structure. In some embodiments, the ground line extends in a second horizontal direction (e.g., perpendicular to the first horizontal direction in which the one or more electrodes extend) and is electrically coupled to the additional drain region of additional vertical transistors of a plurality of vertical inverters of the array of vertical inverters. In some embodiments, the source region of the first vertical transistor horizontally neighbors and is spaced from the ground line by the dielectric material. Providing the ground line to horizontally neighbor the source region of the first vertical transistor facilitates increasing a quantity of holes (e.g., lack of electrons) in the source region, to enhance operating properties of the first vertical transistor of the vertical inverter.

The vertical inverter may exhibit a surface area (e.g., a horizontal footprint) of $4F^2$, wherein F is a minimum feature size. Having the first vertical transistor horizontally neighbor the second vertical transistor and having the first vertical transistor be isolated from the second vertical transistor by the dielectric material facilitates forming the vertical inverter to exhibit the $4F^2$ cell size, wherein F is a minimum feature size of the vertical inverter. In addition, forming the vertical inverter over the base material rather than within the base material facilitates formation of an array of vertical inverters occupying a smaller horizontal area compared to conventional devices, facilitating an increase in density of the array of vertical inverters.

Figure 1B:
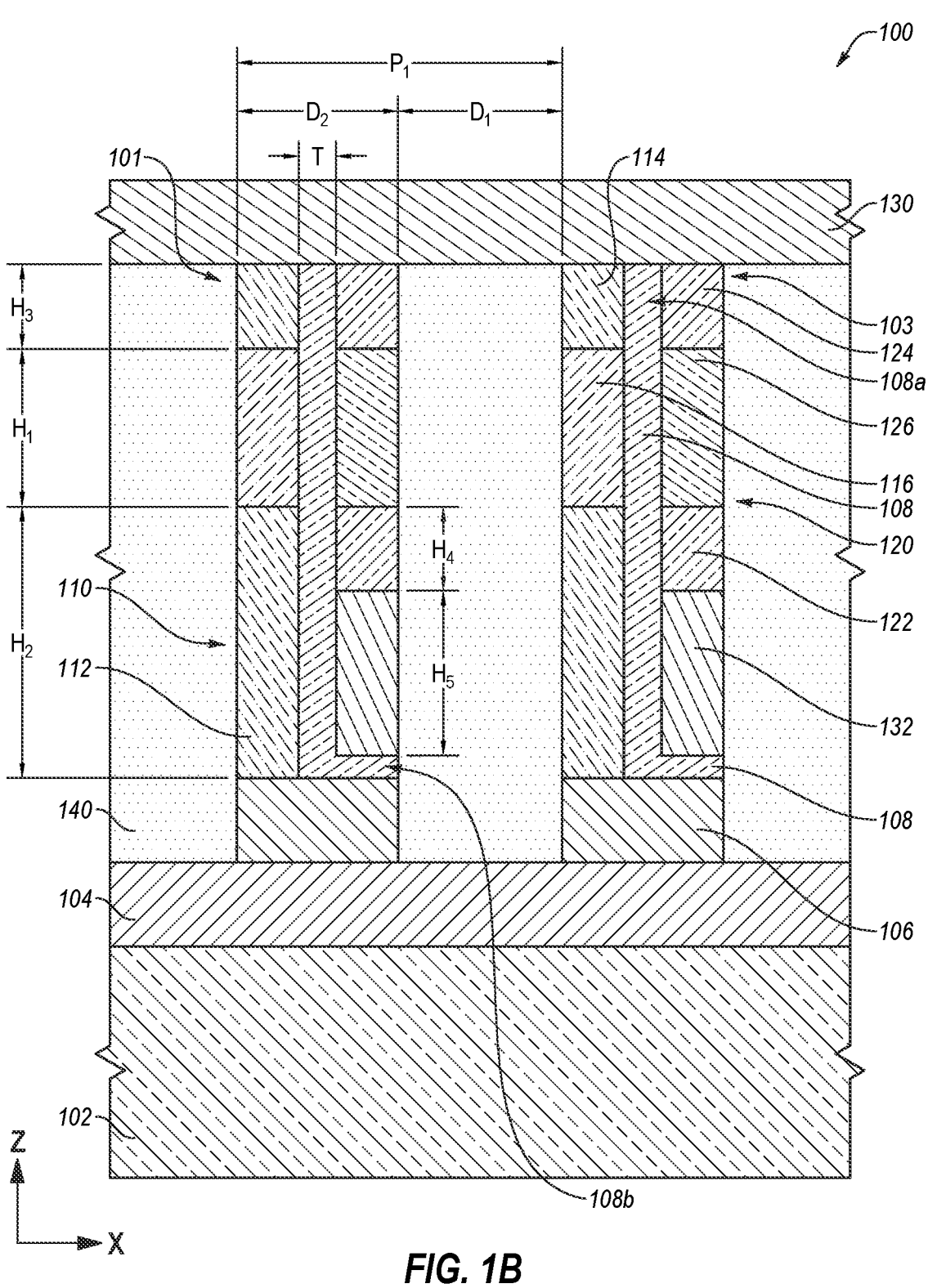
Figure 1C:
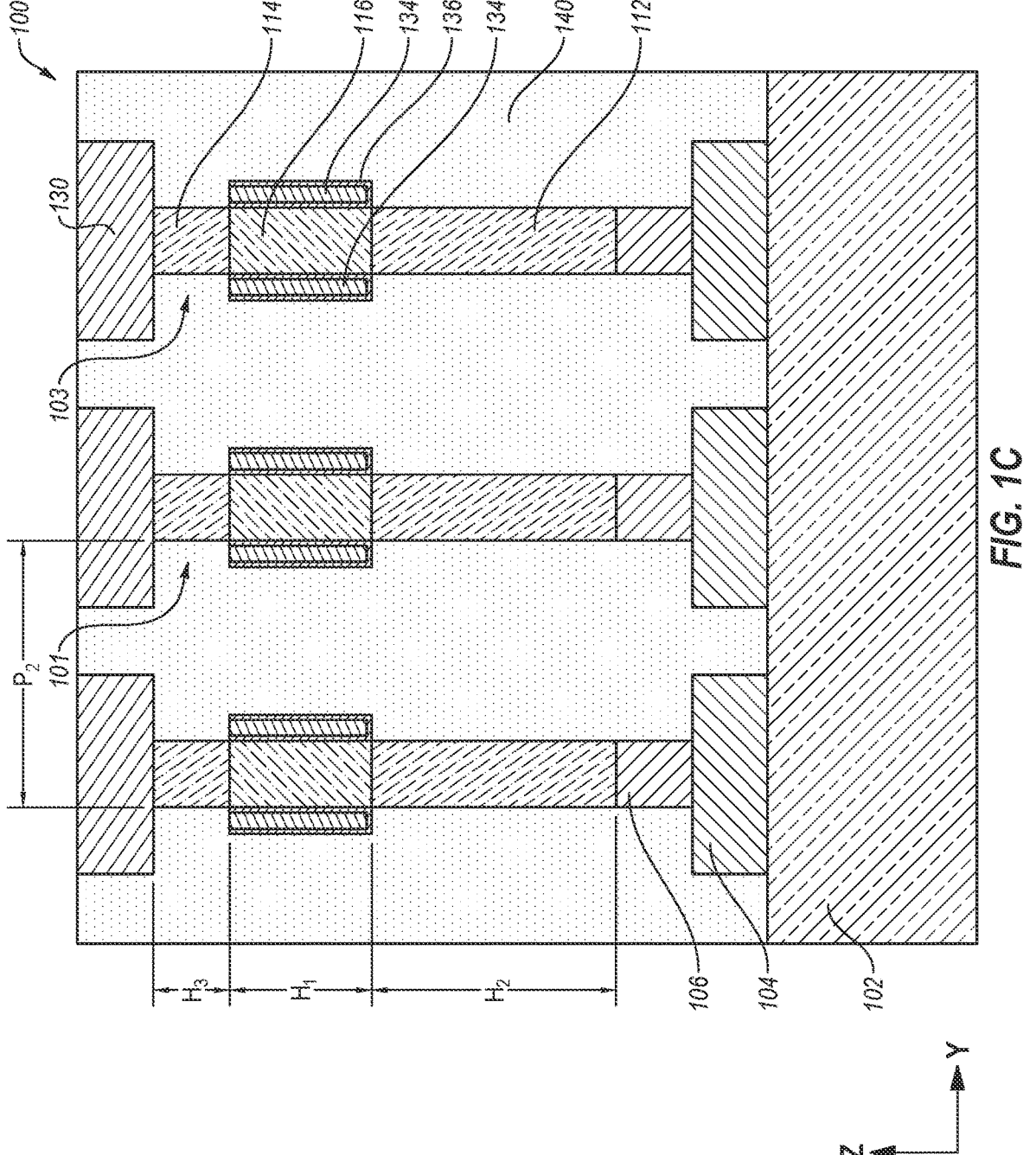
Figure 1D:
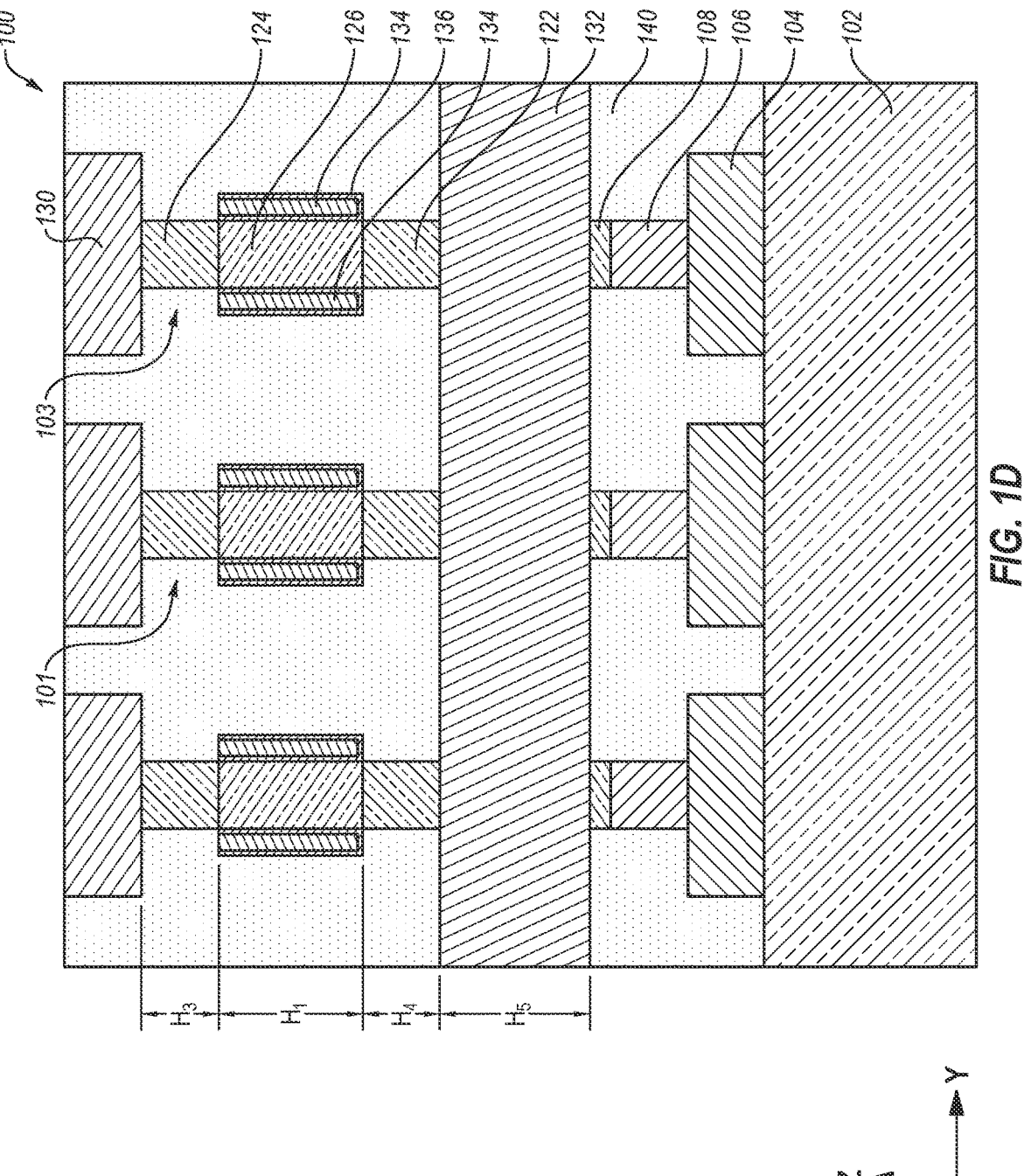
Figure 1E:
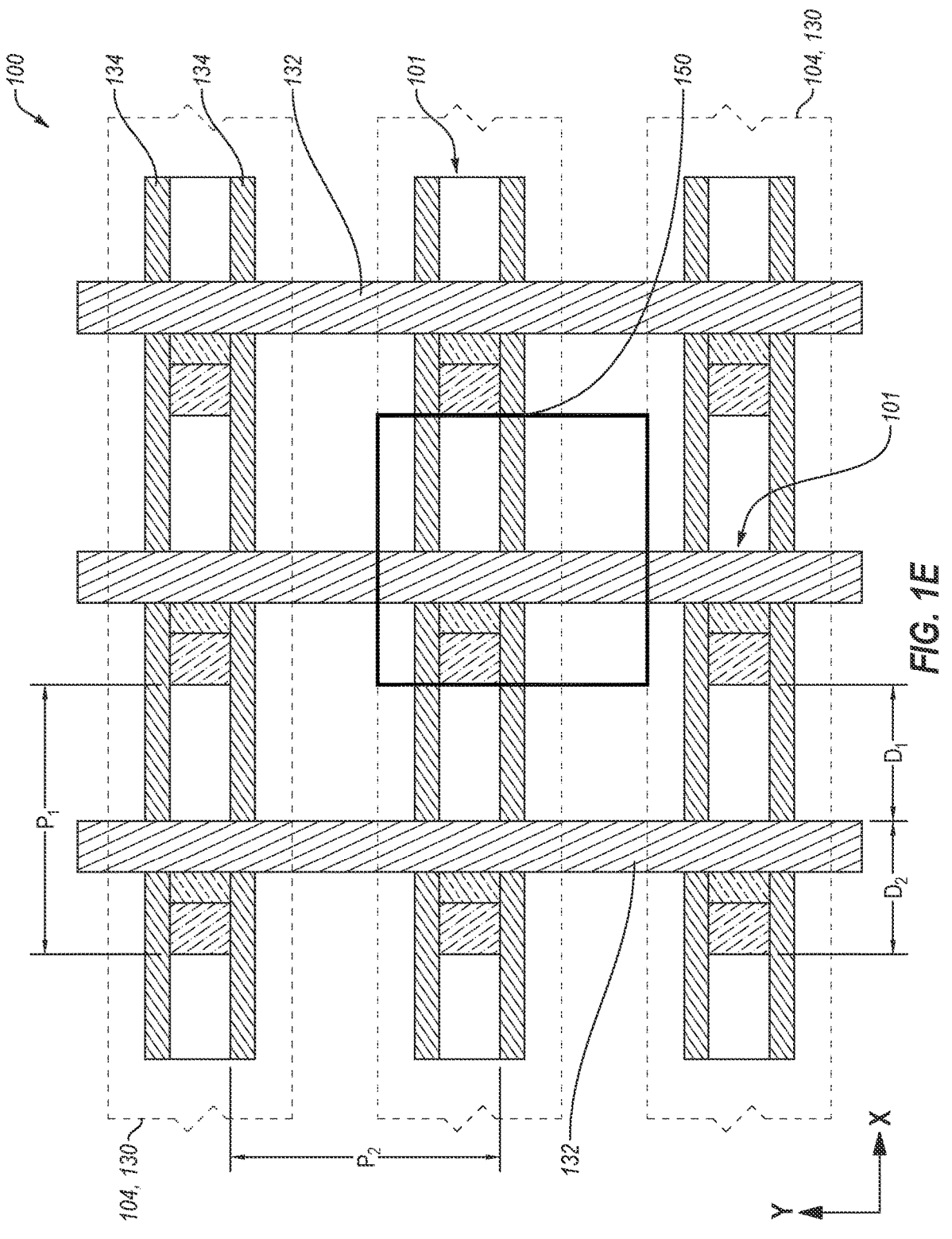

FIG. 1A is a simplified partial perspective view of a microelectronic device 100 including an array of vertical inverters 101, in accordance with embodiments of the disclosure. FIG. 1B is a simplified, partial cross-sectional view of the microelectronic device 100 illustrating a first cross-section of the microelectronic device 100 in a first direction (e.g., in the XZ plane). FIG. 1C and FIG. 1D are simplified, partial cross-sectional views of the microelectronic device 100 in a second direction (e.g., in the YZ plane). FIG. 1E is a simplified, partial top-down view of the array of the microelectronic device 100. While FIG. 1E illustrates components of the microelectronic device 100, it will be understood that not all of the components of the microelectronic device 100 would be visible in a top-down view of the microelectronic device 100 or in the same XY cross-section.

With reference to FIG. 1A through FIG. 1E, the microelectronic device 100 includes an array of vertical inverters 101 horizontally spaced (e.g., in the X-direction, in the Y-direction) from one another. Each vertical inverter 101 comprises a vertically extending (e.g., in the Z-direction) pillar 103 (FIG. 1A). Each of the pillars 103 individually comprises a first vertical transistor 110 and a second vertical transistor 120 horizontally neighboring the first vertical transistor 110. The first vertical transistor 110 is electrically isolated from the second vertical transistor 120 by a dielectric material 108 horizontally intervening (e.g., in the X-direction) between the first vertical transistor 110 and the second vertical transistor 120. The vertical inverters 101 may be, for example, a vertically oriented complementary metal-oxide-semiconductor (CMOS) inverter (also referred to herein as a "vertical CMOS inverter").

The vertical inverters 101 may vertically overlie (e.g., in the Z-direction) a base material 102. For example, for an individual vertical inverter 101, the first vertical transistor 110 and the second vertical transistor 120 thereof may individually vertically extend (e.g., in the Z-direction) from the base material 102. The base material 102 may include a semiconductor substrate, a base semiconductor material on a supporting substrate, a metal electrode, or a semiconductor substrate having one or more materials, structures, or regions formed thereon. The base material 102 may comprise a semiconductive material, such as a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base material" in the following description, previous process stages may have been utilized to form materials, regions, or junctions in the base semiconductor structure or foundation. The base material 102 may include one or more materials associated with integrated circuitry fabrication. Such materials may include, for example, one or more of refractory metals, barrier materials, diffusion materials, and insulative materials. The base material 102 may include, for example, complementary metal oxide semiconductor (CMOS) structures, or other semiconductor structures. Different portions of the base material 102 may be electrically isolated from each other by one or more dielectric materials.

Horizontally neighboring (e.g., in the X-direction, in the Y-direction) vertical inverters 101 may be electrically isolated from one another by an insulative material 140. For clarity and ease of understanding the disclosure, the insulative material 140 is not illustrated in FIG. 1A. The insulative material 140 may be formed of and include one or more of an oxide material (e.g., silicon dioxide ($SiO_2$), phosphosilicate glass (PSG), borosilicate glass (BSG), borophosphosilicate glass (BPSG), fluorosilicate glass (FSG), titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), niobium oxide (NbO, $NbO_2$, $Nb_2O_5$), molybdenum oxide ($MoO_2$, $MoO_3$), strontium oxide (SrO), barium oxide (BaO), yttrium oxide ($Y_2O_3$) or a combination thereof), a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), and amorphous carbon. In some embodiments, the insulative material 140 comprises silicon dioxide.

A first conductive line 104 may vertically overlie the base material 102 and be in electrical communication with the first vertical transistor 110 of an individual vertical inverter 101 by way of a conductive contact 106. In some embodiments, the first conductive line 104 extends in a first horizontal direction (e.g., in the X-direction) over the base material 102. With reference to FIG. 1C through FIG. 1E, in some embodiments, the microelectronic device 100 includes a plurality of first conductive lines 104 extending in the first horizontal direction and spaced from one another in a second horizontal direction (e.g., the Y-direction). The first conductive lines 104 may be referred to herein as first "plate lines."

The first conductive lines 104 may be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the first conductive lines 104 individually comprise tungsten. In other embodiments, the first conductive lines 104 individually comprise copper.

As described in further detail below, the first conductive lines 104 may be configured to be operably connected to a supply voltage structure to provide, for example, a supply voltage to a portion of the first vertical transistor 110. In some embodiments, the first conductive lines 104 are coupled to a supply pumped voltage ($V_{CCP}$) structure and the first conductive lines 104 are referred to as "supply voltage lines" or "supply pumped voltage lines." As described in further detail below, the first conductive lines 104 are configured to be electrically coupled to source regions (e.g., source regions 112) of the first vertical transistors 110.

The conductive contact 106 may electrically connect the first vertical transistor 110 of an individual vertical inverter 101 to the first conductive line 104. In some embodiments, the conductive contact 106 vertically (e.g., in the Z-direction) intervenes between the first conductive line 104 and the first vertical transistor 110. As described in further detail below, the conductive contact 106 may directly contact a P-type source region (e.g., source region 112) of the first vertical transistor 110. Since the conductive contact 106 electrically couples the P-type source region of the first vertical transistor 110 to the first conductive line 104, the conductive contact 106 may be referred to herein as a "source contact."

The conductive contact 106 may be formed of and include conductive material, such as, for example, one or more of the materials described above with reference to the first conductive line 104. In some embodiments, the conductive contact 106 comprises substantially the same material composition as the first conductive line 104. In other embodiments, the conductive contact 106 comprises a different material composition than the first conductive line 104. In some embodiments, the conductive contact 106 comprises tungsten. In other embodiments, the conductive contact 106 comprises titanium or titanium nitride.

In some embodiments, the second vertical transistor 120 is electrically isolated from the conductive contact 106 by a portion of the dielectric material 108 vertically intervening between the conductive contact 106 and the second vertical transistor 120.

The first vertical transistor 110 and the second vertical transistor 120 may be formed of and include material exhibiting differing conductivity than one another. By way of non-limiting example, in some embodiments, the first vertical transistor 110 is a P-channel metal-oxide-semiconductor (PMOS) transistor; and the second vertical transistor 120 is an N-channel metal-oxide-semiconductor (NMOS) transistor.

In some embodiments, the first vertical transistor 110 comprises, for example, a source region 112, a drain region 114, and a channel region 116 between the source region 112 and the drain region 114. The channel region 116 may be formed of and include a material formulated to form a conductive path between the respective source region 112 and the drain region 114 responsive to application of a suitable voltage (e.g., a gate voltage, a set bias voltage, a read bias voltage) to the first vertical transistor 110.

In some embodiments, the source region 112 comprises a P-type source region; the drain region 114 comprises a P-type drain region; and the channel region 116 comprises an N-type channel region. In some such embodiments, the source region 112 and the drain region 114 of the first vertical transistor 110 are each individually be formed of and include at least one P-type conductivity material. As used herein, a P-type conductivity material may include, for example, polysilicon doped with at least one P-type dopant (e.g., boron ions, aluminum ions, gallium ions, indium ions). In some embodiments, the at least one P-type dopant comprises boron ions. In some such embodiments, the first vertical transistor 110 comprises a PMOS transistor.

The at least one P-type dopant of the source region 112 may be the same as the at least one P-type dopant of the drain region 114. In other embodiments, the at least one P-type dopant of the source region 112 may be different than the at least one P-type dopant of the drain region 114.

A concentration of the at least one P-type dopant in each of the source region 112 and the drain region 114 may be within the range of from about $5 \times 10^{19}$ atoms/cm³ to about $3 \times 10^{21}$ atoms/cm³, such as from about 5 atoms/cm³ to about $1 \times 10^{20}$ atoms/cm³, from about $1 \times 10^{21}$ atoms/cm³ to about $5 \times 10^{21}$ atoms/cm³, from about $5 \times 10^{21}$ atoms/cm³ to about $1 \times 10^{21}$ atoms/cm³, or from about $1 \times 10^{21}$ atoms/cm³ to about $3 \times 10^{21}$ atoms/cm³.

The channel region 116 may be doped with a dopant having an opposite conductivity type than the source region 112 and the drain region 114. In some embodiments, the channel region 116 of the first vertical transistor 110 is formed of and include at least one N-type conductivity material, such as, for example, polysilicon doped with at least one N-type dopant (e.g., arsenic ions, phosphorous ions, antimony ions).

In some embodiments, the second vertical transistor 120 includes an additional drain region 122, an additional source region 124, and an additional channel region 126 between the additional drain region 122 and the additional source region 124. The additional channel region 126 may be formed of and include a material formulated to form a conductive path between the additional drain region 122 and the additional source region 124 responsive to application of a suitable voltage (e.g., a gate voltage, a set bias voltage, a read bias voltage) to the second vertical transistor 120.

In some embodiments, the additional drain region 122 comprises an N-type drain region; the additional source region 124 comprises an N-type source region; and the additional channel region 126 comprises a P-type channel region. In some such embodiments, the additional drain region 122 and the additional source region 124 of the second vertical transistor 120 are each individually formed of and include at least one N-type conductivity material. As used herein, an N-type conductivity material may include, for example, polysilicon doped with at least one N-type dopant (e.g., arsenic ions, phosphorous ions, antimony ions). In some such embodiments, the second vertical transistor 120 comprises an NMOS transistor.

The at least one N-type dopant of the additional drain region 122 may be the same as the at least one N-type dopant of the additional source region 124. In other embodiments, the at least one N-type dopant of the additional drain region 122 may be different than the at least one N-type dopant of the additional source region 124.

A concentration of the at least one N-type dopant in each of the additional drain region 122 and the additional source region 124 may be within the range of from about $5 \times 10^{19}$ atoms/cm³ to about $3 \times 10^{21}$ atoms/cm³, such as from about 5 atoms/cm³ to about $1 \times 10^{20}$ atoms/cm³, from about $1 \times 10^{20}$ atoms/cm³ to about $5 \times 10^{20}$ atoms/cm³, from about $5 \times 10^{21}$ atoms/cm³ to about $1 \times 10^{21}$ atoms/cm³, or from about $1 \times 10^{21}$ atoms/cm³ to about $3 \times 10^{21}$ atoms/cm³.

The additional channel region 126 may be doped with a dopant having an opposite conductivity type than the additional drain region 122 and the additional source region 124. In some embodiments, the additional channel region 126 of the second vertical transistor 120 is formed of and include at least one P-type conductivity material, such as, for example, polysilicon doped with at least one P-type dopant, such as one or more of boron ions, aluminum ions, gallium ions, indium ions.

Although the first vertical transistor 110 and the second vertical transistor 120 have been described and illustrated as respectively comprising a vertical PMOS transistor and a vertical NMOS transistor, the disclosure is not so limited. In other embodiments, the channel region 116 and the additional channel region 126 may be formed of and include a different material than those described above.

The channel region 116 and the additional channel region 126 may individually comprise a semiconductive material such as, for example, at least one semiconductor material (e.g., one or more of silicon, germanium, at least one compound semiconductor material, and at least one oxide semiconductor material). In some embodiments, the channel region 116 and the additional channel region 126 individually comprise polycrystalline silicon. In additional embodiments, the channel region 116 and the additional channel region 126 may individually comprise an oxide semiconductor material, such as one or more of zinc tin oxide (ZTO; $Zn_xSn_yO_z$), indium zinc oxide (IZO; $In_xZ_yO_z$), zinc oxide ($ZnO_x$), indium gallium zinc oxide (IGZO; $In_xGa_yZn_zO_a$), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_a$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), indium tungsten oxide (IWO; $In_xW_yO_z$), and other similar materials. The channel region 116 and the additional channel region 126 may individually comprise a ternary oxide, including atoms of two different elements and as well as atoms of oxygen. In other embodiments, the channel region 116 and the additional channel region 126 individually comprise a quaternary oxide including atoms of three different elements and atoms of oxygen.

In some embodiments, the channel region 116 of the first vertical transistor 110 comprises a different material composition than the additional channel region 126 of the second vertical transistor 120.

With collective reference to FIG. 1A through FIG. 1D, in some embodiments, at least a portion of the source region 112 of the first vertical transistor 110 horizontally neighbors (e.g., in the X-direction) and at least partially vertically overlaps (e.g., in the Z-direction) the additional drain region 122 of the second vertical transistor 120. In addition, the drain region 114 of the first vertical transistor 110 may horizontally neighbor (e.g., in the X-direction) and at least partially vertically overlap (e.g., in the Z-direction) the additional source region 124 of the second vertical transistor 120. Furthermore, the channel region 116 of the first vertical transistor 110 may horizontally neighbor (e.g., in the X-direction) and at least partially vertically overlap (e.g., in the Z-direction) the additional channel region 126 of the second vertical transistor 120. The dielectric material 108 may horizontally intervene between the channel region 116 of the first vertical transistor 110 and the additional channel region 126 of the second vertical transistor 120.

In some embodiments, a cross-sectional shape of the dielectric material 108 may be substantially L-shaped. In some such embodiments, the dielectric material 108 includes a first portion 108a (FIG. 1B) extending in the vertical direction (e.g., the Z-direction) and a second portion 108b (FIG. 1B) extending in the first horizontal direction (e.g., the X-direction) substantially perpendicular to the vertical direction.

In some embodiments, the first portion 108a of the dielectric material 108 horizontally intervenes (e.g., in the X-direction) between the first vertical transistor 110 and the second vertical transistor 120. For example, the first portion 108a of the dielectric material 108 may horizontally intervene between the drain region 114 and the additional source region 124; the channel region 116 and the additional channel region 126; and the source region 112 and the additional drain region 122.

The dielectric material 108 may be formed of and include an insulative material, such as one or more of the materials described above with reference to the insulative material 140. In some embodiments, the dielectric material 108 comprises substantially the same material composition as the insulative material 140. In other embodiments, the dielectric material 108 comprises a different material composition than the insulative material 140. In some embodiments, the dielectric material 108 comprises silicon dioxide.

In some embodiments, a thickness T (e.g., in the X-direction) (FIG. 1B) of the dielectric material 108 between the channel region 116 and the additional channel region 126 (e.g., the second portion 108b of the dielectric material 108) may be less than a dimension (e.g., a thickness in the X-direction, a thickness in the Y-direction) of the channel region 116 and the additional channel region 126. By way of non-limiting example, the thickness T of the dielectric material 108 separating the first vertical transistor 110 from the second vertical transistor 120 may be within a range of from about 2 nanometers (nm) and about 10 nm, such as from about 2 nm to about 5 nm, or from about 5 nm to about 10 nm.

With reference to FIG. 1B and FIG. 1E, a distance $D_1$ (e.g., in the X-direction) between horizontally neighboring vertical inverters 101 may correspond to a minimum feature size F of the vertical inverters 101. The distance $D_1$ may be within a range of from about 10 nm to about 20 nm, such as from about 10 nm to about 15 nm, or from about 15 nm to about 20 nm. However, the disclosure is not so limited and the distance $D_1$ may be different than those described above.

In some embodiments, the thickness T of the dielectric material 108 between the first vertical transistor 110 and the second vertical transistor 120 (e.g., of the second portion 108b of the dielectric material 108) is less than the distance $D_1$ (FIG. 1B) between horizontally neighboring (e.g., in the X-direction) vertical inverters 101.

A dimension $D_2$ (FIG. 1B, FIG. 1E) (e.g., a width) of an individual vertical inverter 101 in the first horizontal direction (e.g., in the X-direction) may be within a range of from about 10 nm to about 20 nm, such as from about 10 nm to about 15 nm, or from about 15 nm to about 20 nm. In some embodiments, the dimension $D_2$ of an individual vertical inverter 101 is about the same as the distance $D_1$ between horizontally neighboring vertical inverters 101. In other embodiments, the dimension $D_2$ of an individual vertical inverter 101 is different than (e.g., greater than, less than) the distance $D_1$ between horizontally neighboring vertical inverters 101.

With continued reference to FIG. 1B and FIG. 1E, a pitch $P_1$ of the vertical inverters 101 in the first horizontal direction (e.g., in the X-direction) may be within a range of from about 20 nm to about 40 nm, such as from about 20 nm to about 25 nm, from about 25 nm to about 30 nm, from about 30 nm to about 35 nm, or from about 35 nm to about 40 nm. In some embodiments, the pitch $P_1$ may be equal to about two times a minimum feature size of the vertical inverters 101 (e.g., two times F (i.e., 2F)).

Referring to FIG. 1C and FIG. 1E, a pitch $P_2$ of the vertical inverters 101 in the second horizontal direction (e.g., in the Y-direction) may be within a range of from about 20 nm to about 40 nm, such as from about 20 nm to about 25 nm, from about 25 nm to about 30 nm, from about 30 nm to about 35 nm, or from about 35 nm to about 40 nm. In some embodiments, the pitch $P_2$ is about the same as the pitch $P_1$. In other embodiments, the pitch $P_2$ is different than (e.g., greater than, less than) the pitch $P_1$.

With reference to FIG. 1E, an area of a unit cell of the vertical inverters 101, indicated by box 150 (illustrated in a solid line), may be equal to about four times the minimum feature width squared (e.g., $4F^2$) and may be within a range of from about 400 $nm^2$ to about 1,600 $nm^2$, such as from about 400 $nm^2$ to about 800 $nm^2$, from about 800 $nm^2$ to about 1,200 $nm^2$, of from about 1,200 $nm^2$ to about 1,600 $nm^2$.

With collective reference to FIG. 1B through FIG. 1D, for an individual vertical inverter 101, a vertical dimension (e.g., a vertical height) (e.g., in the Z-direction) $H_1$ of the channel region 116 of the first vertical transistor 110 may be substantially the same as a vertical dimension (e.g., vertical height) of the additional channel region 126 of the first vertical transistor 110. In some such embodiments, the channel region 116 may be vertically spaced from the base material by 102 substantially the same distance that the additional channel region 126 is vertically spaced from the base material 102.

The vertical dimension (e.g., in the Z-direction) $H_1$ may be within a range of from about 10 nm to about 100 nm, such as from about 10 nm to about 20 nm, from about 20 nm to about 40 nm, from about 40 nm to about 60 nm, from about 60 nm to about 80 nm, or from about 80 nm to about 100 nm.

With reference to FIG. 1B and FIG. 1C, for an individual vertical inverter 101 a vertical dimension (e.g., in the Z-direction) (e.g., a vertical height) $H_2$ of the source region 112 of the first vertical transistor 110 may be within a range of from about 5 nm to about 100 nm, such as from about 5 nm to about 20 nm, from about 20 nm to about 50 nm, or from about 50 nm to about 100 nm.

With reference to FIG. 1B through FIG. 1D, for an individual vertical inverter 101, a vertical dimension (e.g., in the Z-direction) $H_3$ of each of the drain region 114 of the first vertical transistor 110 and the additional source region 124 of the second vertical transistor 120 may individually be within a range of from about 5 nm to about 50 nm, such as from about 5 nm to about 10 nm, from about 10 nm to about 20 nm, from about 20 nm to about 30 nm, or from about 30 nm to about 50 nm. In some embodiments, the vertical dimension $H_3$ of the drain region 114 of the first vertical transistor 110 is substantially the same as the vertical dimension $H_3$ of the additional source region 124 of the second vertical transistor 120. In other embodiments, the vertical dimension $H_3$ of the drain region 114 of the first vertical transistor 110 is different than (e.g., less than, greater than) the vertical dimension $H_3$ of the additional source region 124 of the second vertical transistor 120.

In some embodiments, for an individual vertical inverter 101, the vertical dimension (e.g., vertical height) (e.g., in the Z-direction) $H_2$ of the source region 112 of the first vertical transistor 110 is greater than the vertical height $H_3$ of each of the drain region 114 of the first vertical transistor 110 and the additional source region 124 of the second vertical transistor 120. In other embodiments, the vertical dimension $H_2$ of the source region 112 is about the same as the vertical dimension $H_3$ of each of the drain region 114 and the additional source region 124.

With reference to FIG. 1B and FIG. 1D, for an individual vertical inverter 101, a vertical dimension (e.g., vertical height) (e.g., in the Z-direction) $H_4$ of the additional drain region 122 of the second vertical transistor 120 may be within a range of from about 5 nm to about 50 nm, such as from about 5 nm to about 10 nm, from about 10 nm to about 20 nm, from about 20 nm to about 30 nm, or from about 30 nm to about 50 nm. In some embodiments, the vertical dimension $H_4$ of the additional drain region 122 of the second vertical transistor 120 is less than the vertical dimension $H_2$ of the source region 112 of the first vertical transistor 110.

In some embodiments, a vertical dimension (e.g., vertical height) (e.g., in the Z-direction) of the first vertical transistor 110 is greater than the vertical height of the second vertical transistor 120.

With collective reference again to FIG. 1A through FIG. 1D, for an individual vertical inverter 101, the drain region 114 of the first vertical transistor 110 and the additional source region 124 of the second vertical transistor 120 may be in electrical communication with a second conductive line 130, which may also be referred to herein as an "output line" or a "common output" of the vertical transistor 100.

In some embodiments, the second conductive line 130 extends in a horizontal direction (e.g., the X-direction). In some such embodiments, the second conductive line 130 is substantially parallel to the first conductive line 104. In other embodiments, the second conductive line 130 extends in a second horizontal direction (e.g., the Y-direction) different than the first horizontal direction in which the first conductive line 104 extends. For example, in some embodiments, the second conductive line 130 is oriented substantially perpendicular to the first conductive line 104. The second conductive line 130 may also be referred to herein as a second "plate line."

The second conductive line 130 may be formed of and include conductive material, such as, for example, one or more of the materials described above with reference to the first conductive line 104. In some embodiments, the second conductive line 130 comprises substantially the same material composition as the first conductive line 104. In other embodiments, the second conductive line 130 comprises a different material composition than the first conductive line 104. In some embodiments, the second conductive line 130 comprises tungsten. In other embodiments, the second conductive line 130 comprises copper.

With reference to FIG. 1A, FIG. 1B, and FIG. 1D, the additional drain region 122 of the second vertical transistor 120 may be in electrical communication with a third conductive line 132. In some embodiments, the additional drain region 122 directly physically contacts the third conductive line 132. In some embodiments, the third conductive line 132 extends in the second horizontal direction (e.g., the Y-direction) perpendicular to the first horizontal direction (e.g., the X-direction) in which the first conductive line 104 and the second conductive line 130 extend. In some embodiments, the third conductive line 132 is configured to be coupled to a ground (GND) structure.

The third conductive line 132 may be electrically isolated from the first conductive line 104 and the conductive contact 106 by the dielectric material 108. In some embodiments, for an individual vertical inverter 101, the dielectric material 108 vertically intervenes (e.g., in the Z-direction) between the third conductive line 132 and the conductive contact 106. For example, the second portion 108b of the dielectric material 108 may vertically (e.g., in the Z-direction) intervene between and electrically isolate the conductive contact 106 and the third conductive line 132 to electrically isolate the third conductive line 132 from the conductive contact 106. In some embodiments, the dielectric material 108 horizontally intervenes (e.g., in the X-direction) between and electrically isolates the third conductive line 132 from the source region 112 of the first vertical transistor 110. For example, the first portion 108a of the dielectric material 108 may horizontally intervene between and electrically isolate the third conductive line 132 from the source region 112 of the first vertical transistor 110.

In some embodiments, the source region 112 of the first vertical transistor 110 horizontally neighbors (e.g., in the X-direction) and at least partially vertically overlaps (e.g., in the Z-direction) the third conductive line 132. The source region 112 of the first vertical transistor 110 may be spaced apart from the third conductive line 132 by the dielectric material 108. In some embodiments, having the third conductive line 132 horizontally neighbor the source region 112 may facilitate increasing a quantity of holes (e.g., absence of electrons) in the source region 112, reducing the electrical resistance of the source region 112 and reducing a power required to operate the first vertical transistors 110.

In some embodiments, the third conductive lines 132 each individually horizontally extend in the second horizontal direction (e.g., in the Y-direction) between and electrically connect to components of horizontally neighboring (e.g., in the Y-direction) vertical inverters 101.

A vertical dimension (e.g., vertical height) (e.g., in the Z-direction) $H_5$ of the third conductive line 132 may be within a range of from about 5 nm to about 50 nm, such as from about 5 nm to about 10 nm, from about 10 nm to about 20 nm, from about 20 nm to about 30 nm, or from about 30 nm to about 50 nm.

The third conductive line 132 may be formed of and include conductive material, such as, for example, one or more of the materials described above with reference to the first conductive line 104. In some embodiments, the third conductive line 132 comprises substantially the same material composition as the first conductive line 104. In other embodiments, the third conductive line 132 comprises a different material composition than the first conductive line 104. In some embodiments, the third conductive line 132 comprises tungsten. In other embodiments, the third conductive line 132 comprises copper. In some embodiments, the third conductive line 132 comprises a first material composition in contact with the additional drain region 122 of the second vertical transistor 120 (or the additional channel region 126 where the second vertical transistor 120 does not include a distinct additional drain region 122 and/or a distinct additional source region 124), and a second material composition different than the first material composition not in direct contact with the second vertical transistor 120 (e.g., the additional drain region 122, the additional channel region 126). The second material composition may include a material exhibiting a lower electrical resistance than the first material composition and may effectuate a lower electrical resistance of the third conductive line 132 compared to conductive lines formed from a single material composition.

Referring now to FIG. 1A, FIG. 1C, and FIG. 1D, one or more word lines 134 (illustrated in broken lines in FIG. 1A for clarity and ease of understanding the description) may horizontally extend (e.g., in the X-direction) proximate the channel region 116 of the first vertical transistor 110 and the additional channel region 126 of the second vertical transistor 120. In some embodiments, the word lines 134 horizontally extend in the first horizontal direction (e.g., the X-direction) substantially perpendicular to the second horizontal direction (e.g., the Y-direction) in which the third conductive lines 132 extend. In some embodiments, the word lines 134 extend in substantially the same direction as the first conductive lines 104 and the second conductive lines 130. The word lines 134 may be referred to herein as "gate electrodes."

In some embodiments, for an individual vertical inverter 101, at least one word line 134 horizontally extends (e.g., in the X-direction) proximate at least a portion of first vertical transistor 110 and at least a portion of the second vertical transistor 120. The word line 134 may be shared by the first vertical transistor 110 and the second vertical transistor 120 of the vertical inverter 101. In some embodiments, for an individual vertical inverter 101, at least one word line 134 horizontally extends proximate to and at least partially vertically overlaps (e.g., in the Z-direction) the channel region 116 of the first vertical transistor 110 and the additional channel region 126 of the second vertical transistor 120.

Each word line 134 may individually extend in a horizontal direction (e.g., the X-direction). In addition, each word line 134 may individually be vertically oriented, such that vertical dimensions (e.g., a vertical height) (e.g., in the Z-direction) thereof are greater than a horizontal dimension thereof in the second horizontal direction (e.g., the Y-direction). In some such embodiments, the word lines 134 may be referred to as "vertically oriented." In some embodiments, the vertical dimension of the word lines 134 may be substantially the same as the vertical dimension $H_1$ of the channel region 116 and the additional channel region 126.

In some embodiments, the word lines 134 have a larger vertical dimension (e.g., vertical height) greater than a vertical dimension (e.g., a vertical height) than each of the first conductive line 104 and the second conductive line 130. In some embodiments, the first conductive lines 104 have a horizontal dimension (e.g., a horizontal width) (e.g., in the Y-direction) width greater than a vertical dimension (e.g., a vertical height) (e.g., in the Z-direction) thereof. In some such embodiments, the first conductive lines 104 and the second conductive lines 130 may be referred to as "horizontally oriented."

In some embodiments, an individual vertical inverter 101 includes two opposing word lines 134, and each of the first vertical transistor 110 and the second vertical transistor 120 of the vertical inverter 101 includes a first of the word line 134 on a first side thereof and a second of the word lines 134 at an opposing side thereof. In some such embodiments, the first vertical transistor 110 and the second vertical transistor 120 may individually comprise so-called "double gated transistors" or "double gated vertical transistors."

The word lines 134 may be formed of and include conductive material, such as, for example, one or more of tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), and polysilicon.

As described above with reference to the third conductive lines 132, the word lines 134 may be formed of and include a first material composition directly contacting the first vertical transistor 110 (e.g., the channel region 116) and the second vertical transistor 120 (e.g., the additional channel region 126) and a second material composition not contacting the first vertical transistor 110 and the second vertical transistor 120. The second material composition may include a material exhibiting a lower electrical resistance than the first material composition and may effectuate a lower electrical resistance of the word lines 134 compared to word lines formed from a single material composition.

The word lines 134 may be separated from the channel region 116 of the first vertical transistor 110 and the additional channel region 126 of the second vertical transistor 120 by a dielectric material 136. For clarity and ease of understanding the description, the dielectric material 136 is not illustrated in FIG. 1A. The dielectric material 136 may be referred to herein as "gate dielectric" material.

The dielectric material 136 may be formed of and include one or more electrically insulative materials, such as phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN))), a dielectric carboxynitride material (e.g., silicon carboxynitride (SiOCN)), another material, or combinations thereof. In some embodiments, the gate dielectric material 136 comprises silicon dioxide.

The dielectric material 136 may be formed of and include a different material composition than each of the dielectric material 108 and the insulative material 140. In some embodiments, the dielectric material 136 comprises a high-k dielectric material having a dielectric constant larger than the dielectric constant of silicon dioxide. In some embodiments, the dielectric material 136 has a dielectric constant greater than about 3.9.

Although the first vertical transistors 110 have been described and illustrated as including a source region 112 and a drain region 114; and the second vertical transistor 120 has been described and illustrated as including an additional source region 124 and an additional drain region 122, the disclosure is not so limited. In other embodiments, an upper portion of the channel region 116 directly contacts the second conductive line 130 or a conductive contact vertically between the channel region 116 and the second conductive line 130; and a lower portion of the channel region 116 directly contacts the conductive contact 106. In some embodiments, an upper portion of the additional channel region 126 directly contacts the second conductive line 130 or a conductive contact vertically between the additional channel region 126 and the second conductive line 130; and a lower portion of the additional channel region 126 directly contacts the third conductive line 132 or a conductive contact vertically between the additional channel region 126 and the third conductive line 132.

With reference to FIG. 1E, in some embodiments, the word lines 134 extend substantially perpendicular to the third conductive lines 132. In some embodiments, the third conductive lines 132 horizontally oriented substantially perpendicular to the first conductive lines 104 and the second conductive lines 130. In some such embodiments, the first conductive lines 104 and the second conductive lines 130 horizontally extend substantially parallel to the word lines 134. The first conductive lines 104 and the second conductive lines 130 may horizontally extend substantially parallel to each other. In other embodiments, the first conductive lines 104 may horizontally extend substantially perpendicular to the second conductive lines 130.

Although FIG. 1A through FIG. 1D have been described and illustrated as including the conductive contact 106 vertically intervening between the first conductive line 104 and the third conductive line 132, the disclosure is not so limited. In other embodiments, the dielectric material 108 (e.g., the second portion 108b of the dielectric material) vertically extends from and between the third conductive line 132 and the first conductive line 104. In some such embodiments, a dimension (e.g., a thickness in the X-direction) of the conductive contact 106 may be less than that illustrated in FIG. 1A and FIG. 1B, and the cross-sectional view of FIG. 1D would not include the conductive contact 106.

Figure 2:
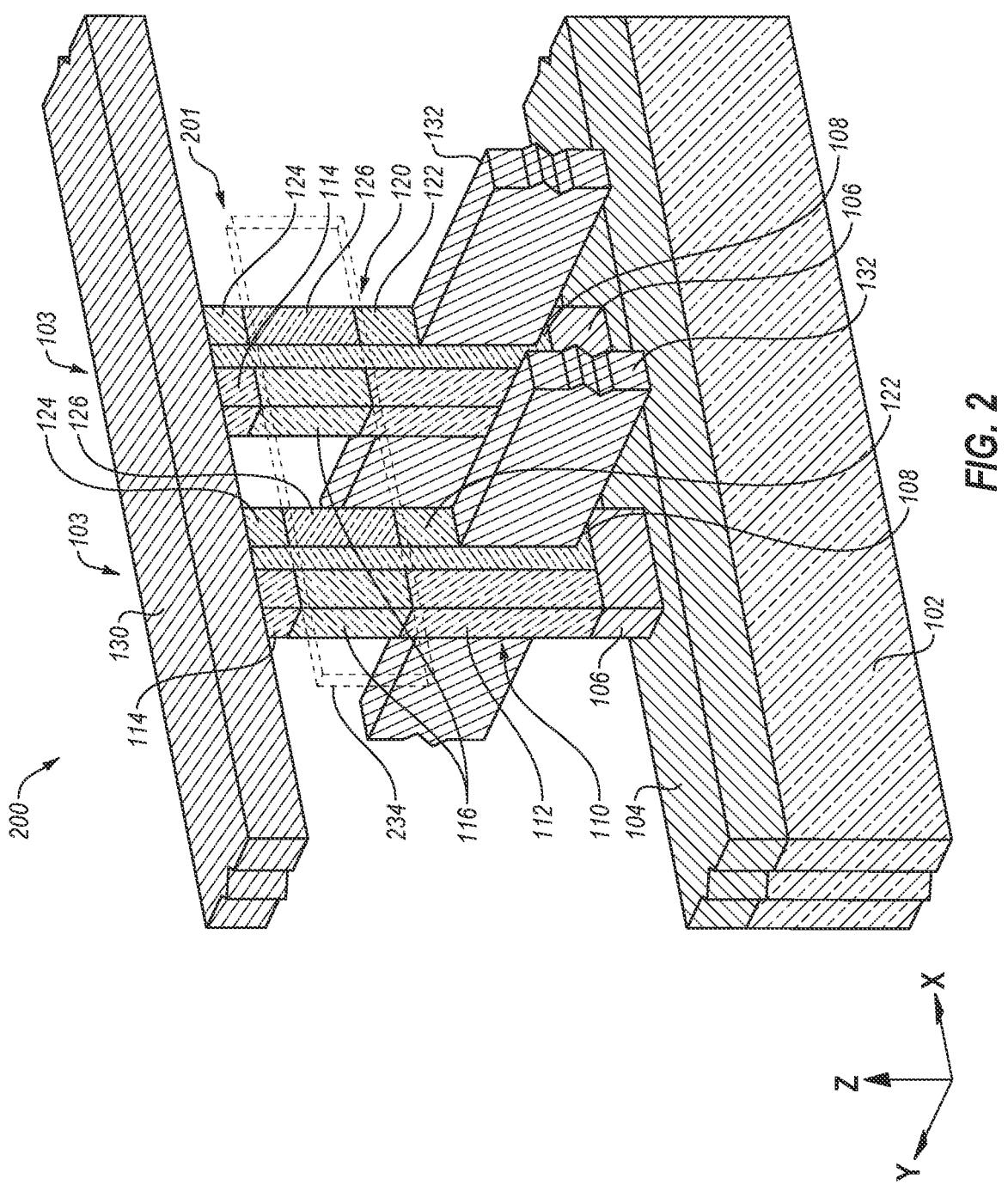
FIG. 2 is a simplified, partial cross-sectional view of a microelectronic device, in accordance with additional embodiments of the disclosure.

Although the first vertical transistor 110 and the second vertical transistor 120 of an individual vertical inverter 101 have been described and illustrated as being "double gated" vertical transistors, the disclosure is not so limited. FIG. 2 is a simplified partial perspective view of a microelectronic device 200 including vertical inverters 201 substantially similar to the vertical inverters 101 of FIG. 1A through FIG. 1D, except that only one word line 234 neighbors the channel region 116 and the additional channel region 126 on a single side of the vertical inverters 201. In some such embodiments, the first vertical transistor 110 and the second vertical transistor 120 of an individual vertical inverter 101 may be referred to as "single gated" vertical transistors. The word line 234 may be substantially similar to one of the word lines 134 previously described herein with reference to FIG. 1A through FIG. 1D.

Figure 3:
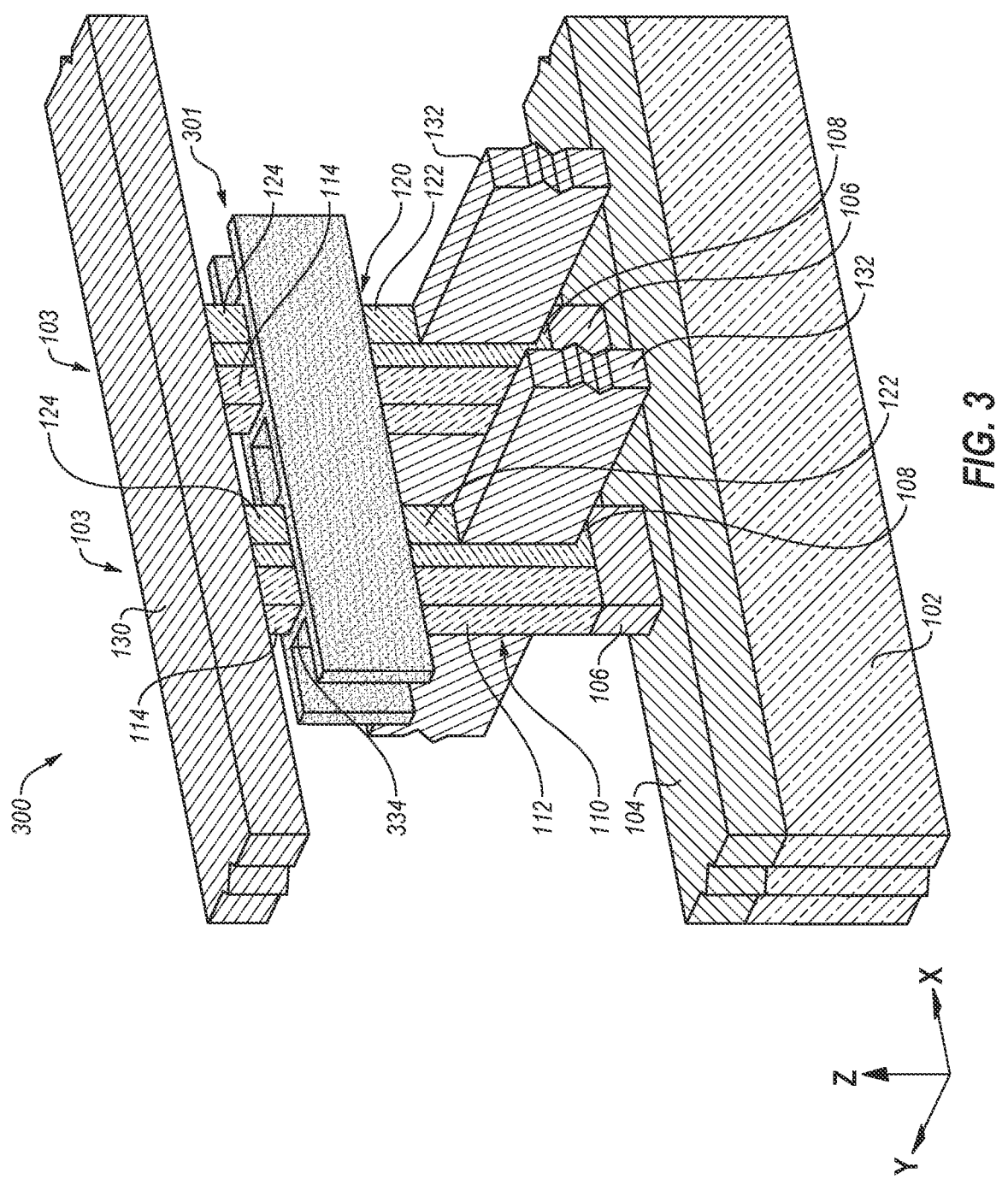
FIG. 3 is a simplified, partial cross-sectional view of a microelectronic device, in accordance with other embodiments of the disclosure.

FIG. 3 is a simplified perspective view of a microelectronic device 300 including vertical inverters 301 substantially similar to the vertical inverters 101 of FIG. 1A through FIG. 1D, except that, for an individual vertical inverter 101, a word line 334 horizontally neighbors (e.g., in the Y-direction, in the X-direction) and at least partially vertically overlaps (e.g., in the Z-direction) the channel region 116 and the additional channel region 126 on substantially all sides (e.g., every side) of the vertical inverter 301. In some such embodiments, the first vertical transistor 110 and the second vertical transistor 120 may be referred to as "gate all around" (GAA) vertical transistors. The word lines 334 in FIG. 3 are not illustrated in broken lines to illustrate the word lines 334 around the first vertical transistors 110 and the second vertical transistors 120.

In use and operation, the vertical inverters 101, 201, 301 receive an input voltage from the word lines 134. The input voltage applied to the word lines 134 may cause the formation of a conductive inversion channel in the channel region 116 and the additional channel region 126 of one of the first vertical transistors 110 and the second vertical transistors 120 neighboring the word lines 134, depending on the input voltage potential. In turn, the creation of an inversion channel in the channel region 116 or the additional channel region 126 of the respective ones of the first vertical transistors 110 or the second vertical transistor facilitates conduction between the respective source and drain regions within respective first vertical transistor 110 or the second vertical transistor 120, which are electrically connected to external potential levels. The drain region 114 and the additional source region 124 may be coupled to the output of the vertical inverter 101, 201, 301 (e.g., the second conductive line 130).

The vertical inverters 101, 201, 301 may be used in a memory device. For example, the vertical inverters 101, 201, 301 may be used in circuitry of a memory device, such as sense amplifiers, comparators, and other circuitry. In some such embodiments, the vertical inverters 101, 201, 301 comprise a portion of control logic circuitry (e.g., sense amplifiers, word line drivers, column drivers) that is operably coupled to memory cells of the memory device.

Figure 4:
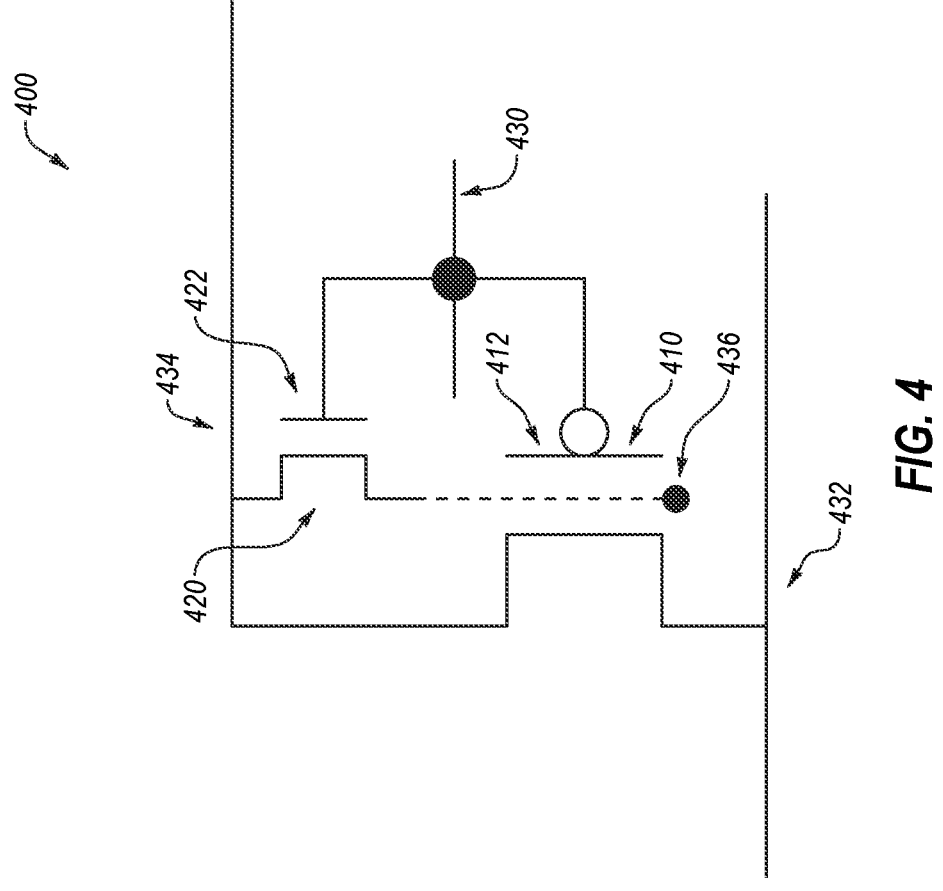
FIG. 4 is a simplified circuit diagram of a vertical inverter, in accordance with embodiments of the disclosure.

FIG. 4 is a simplified circuit diagram of a vertical inverter 400 corresponding to one of the vertical inverters 101, 201, 301, in accordance with embodiments of the disclosure. The vertical inverter 400 includes a first transistor 410 (e.g., the first vertical transistor 110) and a second transistor (e.g., the second vertical transistor 120). The first transistor 410 includes a first gate 412 coupled to at least one word line 430 (e.g., the word line 134) and the second transistor 420 includes a second gate 422 coupled to the same at least one word line 430. The first gate 412 and the second gate 422 may individually comprise a portion of the at least one word line 430 located proximate (e.g., horizontally neighboring) the first transistor 410 and the second transistor 420, respectively. Accordingly, the conductive word line 430 is shared between the first transistor 410 and the second transistor 420.

A source region (e.g., the source region 112) of the first transistor 410 is electrically coupled to a first conductive line 432 (e.g., the first conductive line 104). A drain region (e.g., the drain region 114) of the first transistor 410 and a source region (e.g., the additional source region 124) of the second transistor 420 may be electrically coupled to an output line 434 (e.g., the second conductive line 130). A drain region (e.g., the additional drain region 122) of the second transistor 420 may be electrically coupled to a ground line 436 (e.g., the third conductive line 132).

In use and operation, the at least one word line 430 serves as an input structure of the vertical inverter 400. Responsive to application of a suitable threshold voltage to the first gate 412 or the second gate 422 by way of the at least one word line 430, a current is induced in the channel region of the respective one of the first transistor 410 or the second transistor 420. An output voltage communicate to the output line 434 may be different than an input voltage received from the at least one word line 430 (e.g., if the input voltage is HIGH voltage, the voltage of the output line 434 may be LOW voltage; if the input voltage is LOW voltage, the voltage of the output line 434 may be HIGH voltage).

Thus, in accordance with embodiments of the disclosure, a microelectronic device comprises a vertical inverter comprising a pillar structure vertically extending above a first conductive line, the pillar structure comprising a first vertical transistor vertically overlying and in electrical communication with the first conductive line, a second conductive line vertically overlying the first conductive line and electrically isolated from the first conductive line by a dielectric material, the second conductive line configured to be coupled to a ground structure, a second vertical transistor horizontally neighboring the first vertical transistor and in electrical communication with the second conductive line, the second vertical transistor horizontally spaced from the first vertical transistor by the dielectric material, and at least one electrode horizontally extending along a channel region of the first vertical transistor and an additional channel region of the second vertical transistor.

Furthermore, in accordance with additional embodiments of the disclosure a microelectronic device comprises a vertical inverter comprising a first vertical transistor comprising a channel region between a source region and a drain region, a second vertical transistor horizontally neighboring the first vertical transistor, the second vertical transistor comprising an additional channel region horizontally neighboring the channel region of the first vertical transistor, and a dielectric material horizontally intervening between the first vertical transistor and the second vertical transistor. The microelectronic device further comprises a ground structure directly contacting an additional drain region of the second vertical transistor and separated from the source region of the first vertical transistor by the dielectric material.

Moreover, in accordance with yet additional embodiments of the disclosure, a microelectronic device comprises an array of vertical inverters comprising a vertical inverter comprising a first vertical transistor comprising a channel region, a second vertical transistor horizontally neighboring the first vertical transistor and comprising an additional channel region horizontally neighboring and at least partially within vertical boundaries of the channel region of the first vertical transistor, at least one electrode extending in a first horizontal direction along at least one side of the channel region and at least one side of the additional channel region and separated from the channel region and the additional channel region by dielectric material, a vertical dimension of the at least one electrode greater than a horizontal dimension of the at least one electrode, and a conductive line configured to be electrically connected to a ground structure, the conductive line contacting the second vertical transistor and spaced from the first vertical transistor by additional dielectric material.

Figure 5:
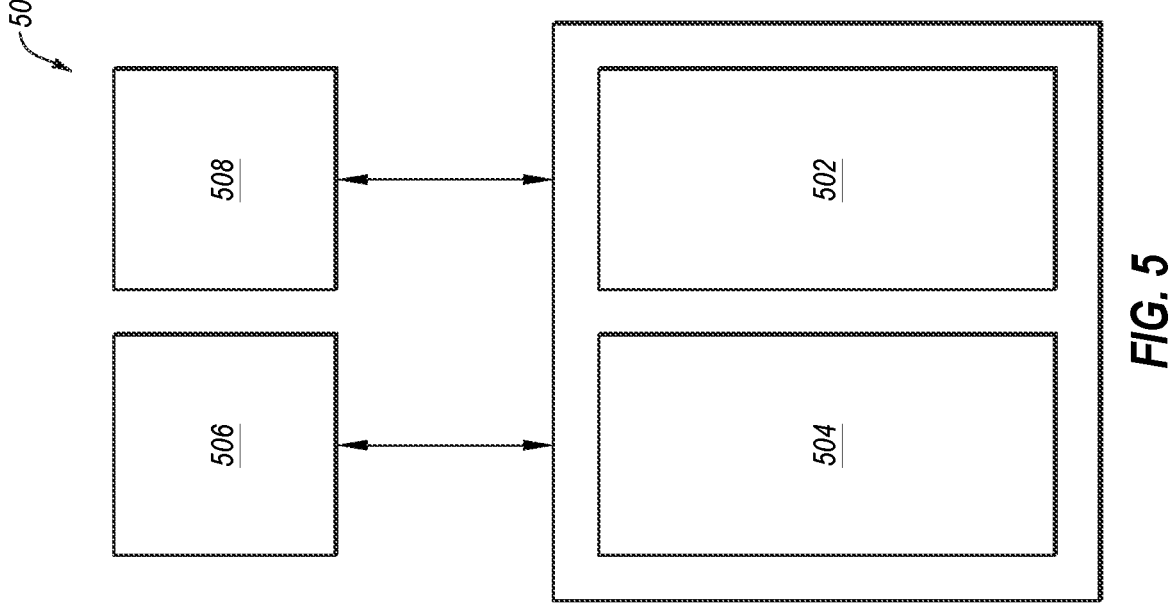
FIG. 5 is a schematic block diagram of an electronic system, in accordance with embodiments of the disclosure.

Inverters (e.g., the vertical inverters 101, the vertical inverters 201, the vertical inverters 301, the vertical inverter 400) and microelectronic devices (e.g., the microelectronic device 100, the microelectronic device 200, the microelectronic device 300) in accordance with embodiments of the disclosure may be used in embodiments of electronic systems of the disclosure. For example, FIG. 5 is a schematic block diagram of an electronic system 500 according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 500 includes a memory device 502. The memory device 502 may include, for example, one or more of an inverter (e.g., the vertical inverter 101, the vertical inverter 201, the vertical inverter 301, the vertical inverter 400) and a microelectronic device (e.g., the microelectronic device 100, the microelectronic device 200, the microelectronic device 300) previously described herein. The electronic system 500 may further include an electronic signal processor device 504 (often referred to as a "microprocessor"). The electronic signal processor device 504 may, optionally, include one or more of an inverter (e.g., the vertical inverter 101, the vertical inverter 201, the vertical inverter 301, the vertical inverter 400) and a microelectronic device (e.g., the microelectronic device 100, the microelectronic device 200, the microelectronic device 300) previously described herein. While the memory device 502 and the electronic signal processor device 504 are depicted as two (2) separate devices in FIG. 5, in additional embodiments, a single (e.g., only one) memory/processor device having the functionalities of the memory device 502 and the electronic signal processor device 504 is included in the electronic system 500. In such embodiments, the memory/processor device may include one or more of an inverter (e.g., the vertical inverter 101, the vertical inverter 201, the vertical inverter 301, the vertical inverter) and a microelectronic device (e.g., the microelectronic device 100, the microelectronic device 200, the microelectronic device 300) previously described herein. The electronic system 500 may further include an input device 506 for inputting information into the electronic system 500 by a user, such as, for example, a mouse or other pointing device, a keyboard, a touchpad, a button, or a control panel. The electronic system 500 may further include an output device 508 for outputting information (e.g., visual or audio output) to a user such as, for example, one or more of a monitor, a display, a printer, an audio output jack, and a speaker. In some embodiments, the input device 506 and the output device 508 comprise a single touchscreen device that can be used both to input information to the electronic system 500 and to output visual information to a user. The input device 506 and the output device 508 may electrically communicate with one or more of the memory device 502 and the electronic signal processor device 504.

Thus, in accordance with embodiments of the disclosure, an electronic system comprises an input device, an output device, a processor device operably connected to the input device and the output device, and a memory device operably connected to the processor device and comprising a vertical inverter. The vertical inverter comprises a first vertical transistor comprising a channel region, a second vertical transistor comprising an additional channel region, the additional channel region horizontally neighboring the channel region, and a shared electrode extending horizontally across and between a side of the channel region and a side of the additional channel region. The memory device further comprises an additional vertical inverter horizontally spaced from the vertical inverter, a distance between the vertical inverter and the additional vertical inverter greater than an additional distance between the first vertical transistor and the second vertical transistor.

The structures and devices of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures and devices of the disclosure may also improve scalability, efficiency, and simplicity as compared to conventional structures and conventional devices. For example, the vertical inverters 101, 201, 301 may be oriented vertically (e.g., comprise the first vertical transistor 110 and the second vertical transistor 120) and may be formed vertically above the base material 102. By way of contrast, conventional inverters of microelectronic devices are formed with planar transistors formed within a base material, consume a relatively large area of the base material. In addition, the configuration of the first vertical transistor 110 and the second vertical transistor 120 within an individual vertical inverter 101, 201, 301 of the disclosure facilitates the vertical inverters 101, 201, 301 having a relatively smaller unit cell size as compared to conventional inverters.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a vertical inverter, comprising:
      a pillar structure vertically extending above a first conductive line, the pillar structure comprising:
         a first vertical transistor vertically overlying and in electrical communication with the first conductive line;
         a second conductive line vertically overlying the first conductive line and electrically isolated from the first conductive line by a dielectric material, the second conductive line configured to be coupled to a ground structure;
         a second vertical transistor horizontally neighboring the first vertical transistor and in electrical communication with the second conductive line, the second vertical transistor horizontally spaced from the first vertical transistor by the dielectric material; and
         at least one electrode horizontally extending along a channel region of the first vertical transistor and an additional channel region of the second vertical transistor;
      wherein the dielectric material is directly adjacent the channel region of the first vertical transistor and the additional channel region of the second vertical transistor.

2. The microelectronic device of claim 1, wherein a drain region of the second vertical transistor directly physically contacts the second conductive line.

3. The microelectronic device of claim 1, wherein:
   the first vertical transistor comprises a vertical PMOS transistor; and
   the second vertical transistor comprises a vertical NMOS transistor.

4. The microelectronic device of claim 1, wherein the channel region of the first vertical transistor horizontally neighbors the second conductive line.

5. The microelectronic device of claim 1, wherein the at least one electrode horizontally extends substantially perpendicular to the second conductive line.

6. The microelectronic device of claim 1, further comprising a third conductive line vertically overlying and in electrical communication with the first vertical transistor and the second vertical transistor.

7. The microelectronic device of claim 1, wherein a vertical dimension of the first vertical transistor is greater than a vertical dimension of the second vertical transistor.

8. The microelectronic device of claim 1, wherein one or more of the channel region of the first vertical transistor and the additional channel region of the second vertical transistor comprises an oxide semiconductor material.

9. The microelectronic device of claim 1, wherein the at least one electrode has a vertical dimension greater than a vertical dimension of one or more of the first conductive line and the second conductive line.

10. A microelectronic device, comprising:
   a vertical inverter comprising:
      a first vertical transistor comprising a channel region between a source region and a drain region;
      a second vertical transistor horizontally neighboring the first vertical transistor, the second vertical transistor comprising an additional channel region horizontally neighboring the channel region of the first vertical transistor; and
      a dielectric material horizontally intervening between the first vertical transistor and the second vertical transistor; and
   a ground structure directly contacting an additional drain region of the second vertical transistor and separated from the source region of the first vertical transistor by the dielectric material, the ground structure vertically underlying each of the channel region of the first vertical transistor and the additional channel region of the second vertical transistor.

11. The microelectronic device of claim 10, further comprising at least one electrode horizontally extending along each of the channel region and the additional channel region, the at least one electrode spaced from the channel region and the additional channel region by an additional dielectric material.

12. The microelectronic device of claim 11, wherein the additional dielectric material comprises a different material composition than the dielectric material.

13. The microelectronic device of claim 11, wherein the at least one electrode extends in a horizontal direction different than a horizontal direction in which the ground structure extends.

14. The microelectronic device of claim 10, further comprising an output structure vertically overlying the first vertical transistor and the second vertical transistor and directly physically contacting the drain region of the first vertical transistor.

15. The microelectronic device of claim 14, wherein the output structure horizontally extends substantially perpendicular to the ground structure.

16. The microelectronic device of claim 10, wherein:
the source region comprises P-type dopant;
the drain region comprises additional P-type dopant; and
the channel region comprises N-type dopant.

17. The microelectronic device of claim 16, wherein the additional channel region comprises P-type dopant.

18. The microelectronic device of claim 10, further comprising electrodes individually horizontally neighboring the channel region and the additional channel region, the first vertical transistor and the second vertical transistor horizontally intervening between the electrodes.

19. The microelectronic device of claim 10, further comprising an additional vertical inverter horizontally neighboring the vertical inverter, a distance between the vertical inverter and the additional vertical inverter greater than an additional distance between the first vertical transistor and the second vertical transistor.

20. The microelectronic device of claim 19, wherein a pitch of the vertical inverter and the additional vertical inverter is within a range of from about 20 nm to about 40 nm.

* * * * *